United States Patent [19]
Kim

[11] Patent Number: 6,018,560
[45] Date of Patent: Jan. 25, 2000

[54] UP/DOWN COUNTER

[75] Inventor: Byung-Doo Kim, Pusan, Rep. of Korea

[73] Assignee: LG Semicon Co., Ltd., Cheongju, Rep. of Korea

[21] Appl. No.: 09/071,744

[22] Filed: May 4, 1998

[30] Foreign Application Priority Data

Jun. 3, 1997 [KR] Rep. of Korea .................. 97-22917

[51] Int. Cl.[7] ........................................ G06M 3/00
[52] U.S. Cl. ........................................ 377/123; 377/45
[58] Field of Search ..................... 377/45, 123

[56] References Cited

U.S. PATENT DOCUMENTS

| | | | |
|---|---|---|---|
| 4,741,006 | 4/1988 | Yamaguchi et al. | 377/126 |
| 4,961,014 | 10/1990 | Kasahara | 377/45 |
| 5,206,890 | 4/1993 | Fujita | 377/45 |

*Primary Examiner*—Margaret R. Wambach
*Attorney, Agent, or Firm*—Fleshner & Kim

[57] ABSTRACT

The counter of the present invention includes an input unit, a sampling unit and a determiner unit. The input unit receives a plurality of control signal including a mode selection signal, a clock signal and a reset signal. The sampling unit receives output signals of the input unit based on the clock signal and reset signal. The sampling unit has a plurality of latches and generating a plurality of first output signals and the adjacent latch of the plurality of latches are coupled to each other. The determiner unit is coupled to the sampling unit to receive the plurality of first output signals and is coupled to the input unit to receive an output signal based on the mode selection signal. The determiner unit outputs a plurality of count signals indicative of a count value, which is incremented or decremented based on the mode selection signal.

11 Claims, 6 Drawing Sheets

UP/DOWN COUNTER

BACKGROUND OF THE INVENTION

1. Field of the Invention

The present invention relates to a counter and, more particularly, to an up/down convertible counter.

2. Background of the Related Art

FIG. 1 illustrates a related up/down counter. A first inverter I1 inverts a mode selection signal MS, which determines the function mode of the counter as up or down counter. A third inverter I3 inverts a clock signal CLK having a prescribed clock cycle to provide a standard for the counter's operation.

A first D flipflop DF1 includes a synchronous clock terminal CK for receiving the clock signal CLK, and an inverted synchronous clock terminal CKB for receiving the output signal of the third inverter I3. An output signal Q1 is generated at a positive logic output Q based on a data input D, and a signal at a negative logic output QB, which is an inverted output signal of the positive logic output Q, is fed back into the data input D.

A first AND gate A1 performs a logic AND operation of the output signal of the positive logic output Q of the first D flipflop DF1 and the mode selection signal MS. A second AND gate A2 performs an AND operation between the output signal of the negative logic output QB of the first D flipflop DF1 and that of the first inverter I1. A first OR gate OR1 performs a logic OR operation with the output signals of the first and second AND gates A1 and A2. A fourth inverter I4 inverts the output signal of the first OR gate OR1. For a 3-bit binary counting, the counter includes a second D flipflop DF2 and a third D flipflop DF3 having the same configuration as the first flipflop DF1 to produce output signals Q2 and Q3. Moreover, a second group of logic gates A3, A4, OR2 and I5 are included between the second and third flipflops DF2 and DF3, which is similarly configured as the first group of logic gates A1, A2, OR1 and I4. The output of a second inverter I2 for inverting a reset signal RST to initialize the counter's operation is connected to the inverted resetting terminals RB of all D flipflops DF1, DF2 and DF3.

The related art up/down counter has various disadvantages related to modularity, integration and functionality. For example, as shown in FIG. 1, there are three flipflops and two groups of logic gates for a 3-bit binary up/down counter. As the number of bits increases, the number of logic gate groups increases proportionately, resulting in undesirable chip size increase.

SUMMARY OF THE INVENTION

Accordingly, an object of the present invention is to provide an up/down counter with improved degree of integration.

Another object of the present invention is to decrease the number of transistors in an up/down counter.

To achieve these and other advantages and in accordance with the purpose of the present invention, as embodied and broadly described, a up/down convertible counter includes: a down counter section comprising a plurality of delay units for receiving a synchronizing signal, the synchronizing signal being the positive and negative signals of a signal whose logic state is converted by designated periods, and converting the signal of a data input at a first logic state conversion position of a clock signal concerned, into positive and negative state signals, each of the delay units feeding back its negative state output signal into its data input, the foremost delay unit receiving the positive and negative signals of the clock signal being in a designated frequency band as a synchronizing signal, the succeeding delay units receiving the positive and negative output signals transferred from the previous delay unit; and a plurality of output signal state converters connected to the respective delay units of the down counter section one by one, receiving a control signal to invert or non-invert the positive output signal generated from each of the delay units connected thereto, the control signal being the positive and negative signals of a mode selection signal for determining a counting operation mode as up or down mode, the output signal state converters inverting an input signal when the mode selection signal is a first logic state.

The present invention may be also achieved in parts or in a whole by a counter comprising: an input unit receiving a plurality of control signal including a mode selection signal, a clock signal and a reset signal; a sampling unit receiving output signals of the input unit based on the clock signal and reset signal, the sampling unit having a plurality of latches and generating a plurality of first output signals and adjacent latch of the plurality of latches being coupled to each other; and a determiner unit coupled to the sampling unit to receive the plurality of first output signals and coupled to the input unit to receive an output signal based on the mode selection signal, the determiner unit outputting a plurality of count signals indicative of a count value, which is incremented or decremented based on the mode selection signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The counter of the present invention includes an input unit 20, a sampling unit 30 and a determiner unit 40. The input unit 40 receives a plurality of control signals including a mode selection signal MS, a clock signal CLK and a reset signal RST. The sampling unit 30 receives output signals of the input unit 20 based on the clock signal CLK and reset signal RST. The sampling unit 30 has a plurality of latches DFA–DFC and generates a plurality of first output signals with the adjacent latch of the plurality of latches being coupled to each other. Each latch DFA–DFC is composed of a D flipflop and triggered at the positive edge or the negative edge state. The determiner unit 40 is coupled to the sampling unit 30 to receive the plurality of first output signals and is coupled to the input unit 20 to receive an output signal based on the mode selection signal MS. The determiner unit 40 outputs a plurality of count signals indicative of a count value, which is incremented or decremented based on the mode selection signal MS.

Each of the plurality of latches DFA–DFS includes a plurality of inputs D, CK, CKB and RB, a first output Q that generates a corresponding first output signal and a second output QB that generates a second output signal. The first and second outputs Q and QB are coupled to corresponding inputs of the adjacent latch. The determiner unit 40 comprises a plurality of state determiners K1–K3. Each has a first input DOWN to receive the mode selection signal MS, a second input UP to receive an inverted mode selection signal, a third input IN to receive a corresponding first output signal from the sampling unit and a counter output OA–OC for generating a corresponding count signal. Each of the state determiners 40 comprises a first switch TGA coupled to receive the first output signal and a second switch TGB coupled to receive an inverted first output signal. The first and second switches TGA and TGB are responsive to the mode selection signal MS and the inverted mode selection signal such that the count value is incremented or decremented. See also FIG. 5.

Figure 1:
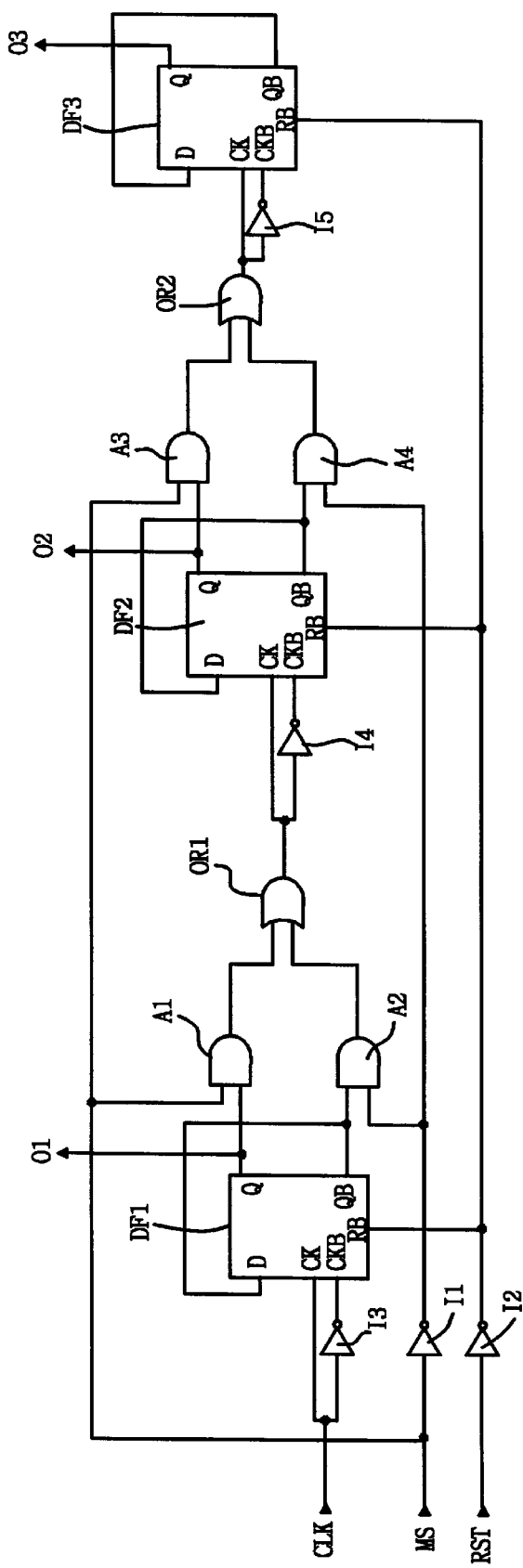
FIG. 1 is an exemplary view of a related art up/down counter.
Figure 2:
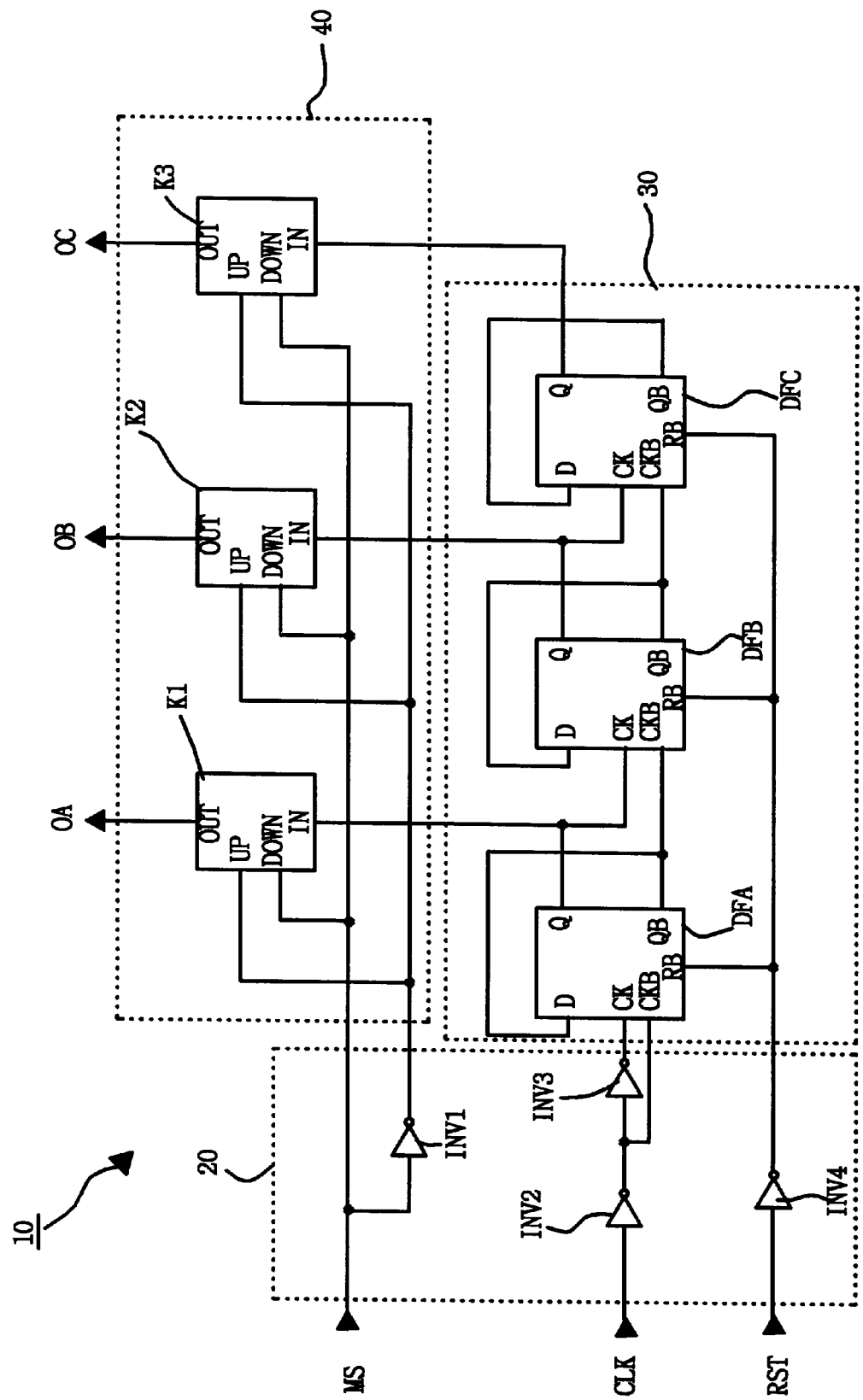
FIG. 2 is an exemplary view of an up/down counter in accordance with an embodiment of the present invention.

FIG. 2 shows an exemplary schematic of the up/down counter 10 in accordance with a preferred embodiment of the present invention having an input unit 20, a sampling unit 30 and a determiner unit 40. A first inverter INV1 of the input unit 20 inverts a mode selection signal MS to determine the counter function mode as up or down counter. A second inverter INV2 inverts the clock signal CLK having a prescribed clock cycle to provide a preferable standard for the counter's operation. A third inverter INV3 inverts the output signal of the second inverter INV2. The first D flipflop DFA of a sampling unit 30 has a synchronous clock terminal CK for receiving the output signal of the third inverter INV3. An inverted synchronous clock terminal CKB receives the output signal of the second inverter INV2, and a positive logic output Q generates the output signal. An output of a negative logic output QB is the inverted output signal of the positive logic output Q, which is fed back into the data input D, A second D flipflop DFB of the sampling unit 30 includes a synchronous clock terminal CK for receiving the output signal of the positive logic output Q of the first D flipflop DFA, and an inverted synchronous clock terminal CKB for receiving the output signal of the negative logic output QB of the first D flipflop DFA. The remaining connections are similar to the first D flipflop DFA. Likewise, the interconnections of the third flipflop DFC is similar to the second D flipflop DFB. The output of a fourth inverter INV4, which inverts a reset signal RST to initialize the counter's operation, is connected to the inverted resetting terminals RB of the D flipflops DFA, DFB and DFC.

Figure 3:
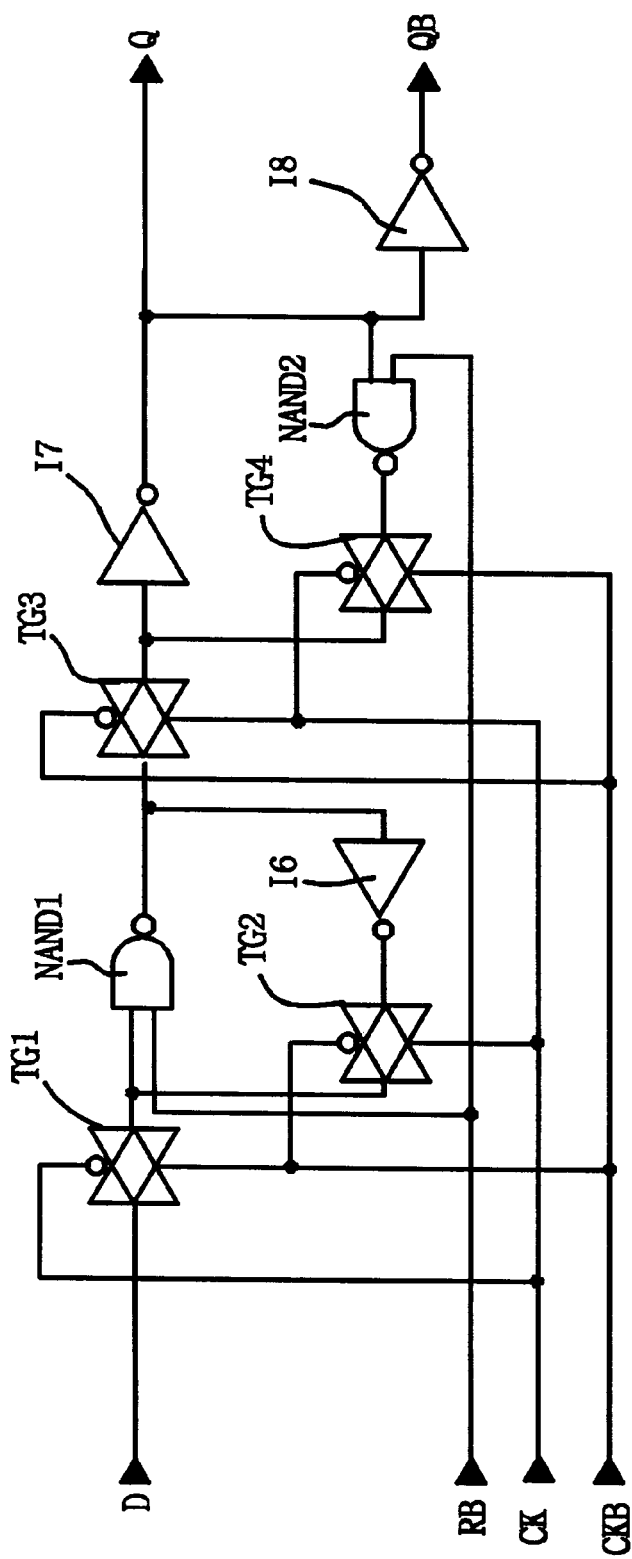
FIG. 3 is an exemplary view of a D flipflop in FIG. 2.

FIG. 3 is an exemplary view of each of the D flipflops DFA, DFB and DFC. The second and third transmission gates TG2 and TG3 turns on when the input signal at the synchronous clock terminal CK is HIGH and the input signal at the inverted synchronous clock terminal CKB is LOW. First and fourth transmission gates TG1 and TG4 turn on when the input signal at the synchronous clock terminal CK is LOW and the input signal at the inverted synchronous clock terminal CKB is HIGH. A first NAND gate NAND1 performs a logic NAND operation with the output signal of the first or second transmission gate TG1 or TG2 and the input signal from the inverted resetting terminal RB. A sixth inverter I6 inverts the output signal of the first NAND gate NANDL and transfers it to the second transmission gate TG2.

A seventh inverter I7 inverts the output signal of the third or fourth transmission gate TG3 or TG4. A second NAND gate NAND2 performs a logic NAND operation with the output signal of the seventh inverter I7 and the input signal from the inverted resetting terminal RB and transfers the resulting signal to the fourth transmission gate TG4. An eighth inverter I8 inverts the output signal of the seventh inverter I7. The output signals through the positive and negative logic output Q and QB employ those of the seventh and eighth inverters I7 and I8, respectively.

Figure 4:
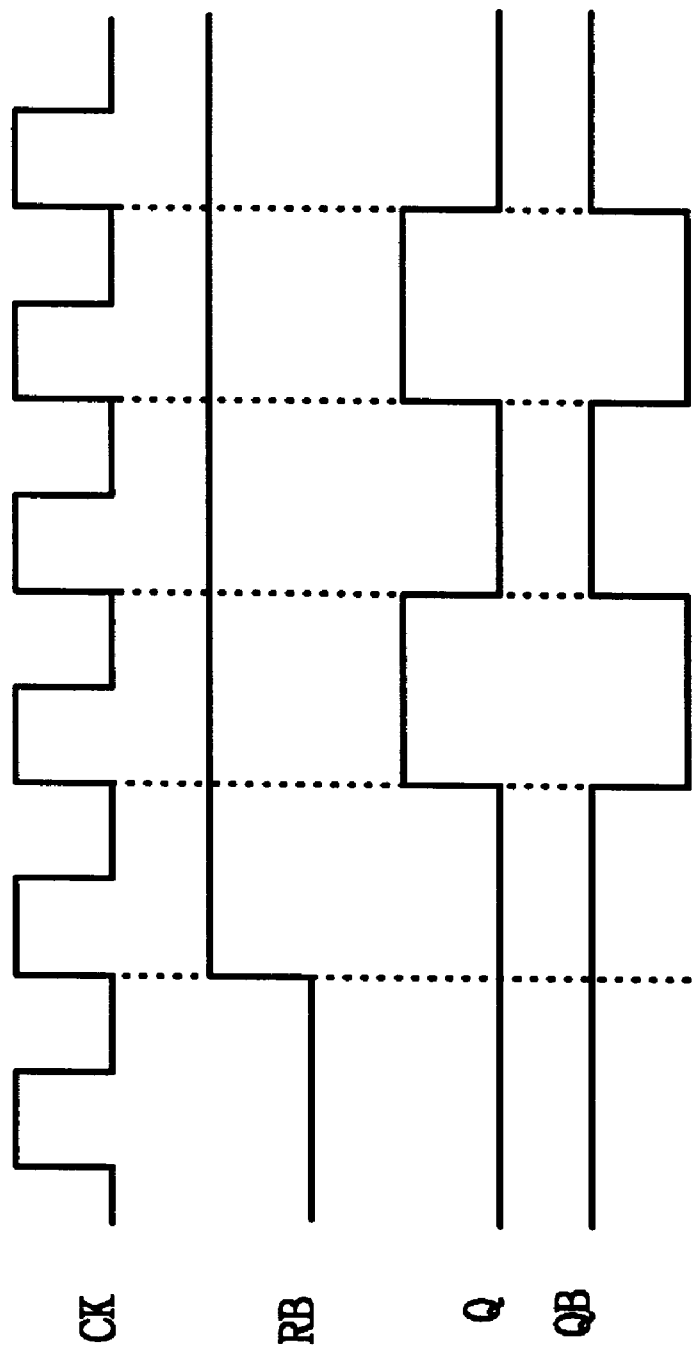
FIG. 4 is an operational waveform diagram of the flipflop in the positive edge state.

FIG. 4 is a waveform diagram of the flipflop relative to a positive edge state of the clock signal CK. When the signal of the inverted resetting terminal RB in the D flipflop is LOW, the output signal of the positive logic output Q is reset in a LOW state and consequently the negative logic output QB generates a HIGH signal.

When the signal of the synchronous clock terminal CK is converted from LOW to HIGH, the data input D receives the output signal of the negative logic output QB. The positive logic output Q generates the output signal of the negative logic output QB in the edge state of the signal received by the data input D, and the negative logic output QB generates the output signal of the positive logic output Q. The output is toggled in the positive edge state of the signal transferred to the synchronous clock terminal CK. Such an operation is termed "sampling," and since each flip-flop DFA, DFB or DFC samples the signal at input D, the element 30 is collectively referred to as a sampling unit.

As shown in FIG. 2, the determiner unit 40 includes a plurality of state determiners K1–K3. Each of first, second and third output signal state determiners K1–K3 includes input terminals UP and DOWN, which receive the mode selection signal MS and the output signal of the first inverter INV1, respectively. The signal from the first inverter INVL serves as an operational control signal to invert or non-invert the output signal of corresponding D flipflops DFA–DFC of the sampling unit 30.

Figure 5:
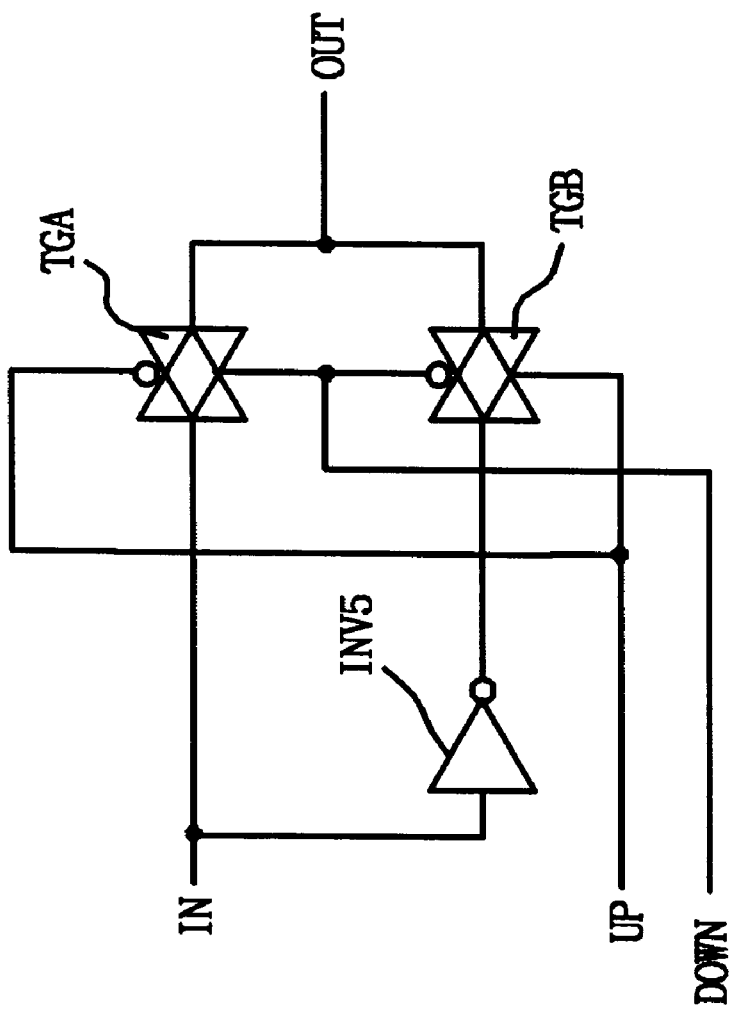
FIG. 5 is an exemplary detail view of the output signal state determiner.

FIG. 5 illustrates a detailed schematic of each of the output signal state determiners K1, K2 and K3 of the determiner unit 40. The mode selection signal MS is fed into a down mode signal input DOWN and the output signal of the first inverter INV1 is fed into an up mode signal input UP. An input terminal IN receives the positive logic output signal connected to the corresponding D flipflops DFA, DFB and DFC.

Each of the output signal state determiners K1, K2 and K3 comprises a fifth inverter INV5 and first and second transmission gates TGA and TGB. The fifth inverter INV5 inverts the positive logic output signal of each of the D flipflop through the input terminal IN. The first transmission gate TGA turns ON or OFF according to the input signals received at the down and up mode signal inputs DOWN and UP. When the input signal of the down mode signal input DOWN is HIGH and the input signal of the up mode signal input UP is LOW, the first transmission gate TGA is turned on and the second transmission gate TGB is turned off so as to transmit the positive logic output signal of the D flipflop received by the input terminal IN to an output terminal OA, OB or OC. When the input signal of the down mode signal input DOWN is LOW and the input signal of the up mode signal input UP is HIGH, the second transmission gate TGB turned on and the first transmission gate TGA is turned off so as to transfer the output signal of the fifth inverter INV5 to the output terminal OA, OB or OC.

Figure 6:
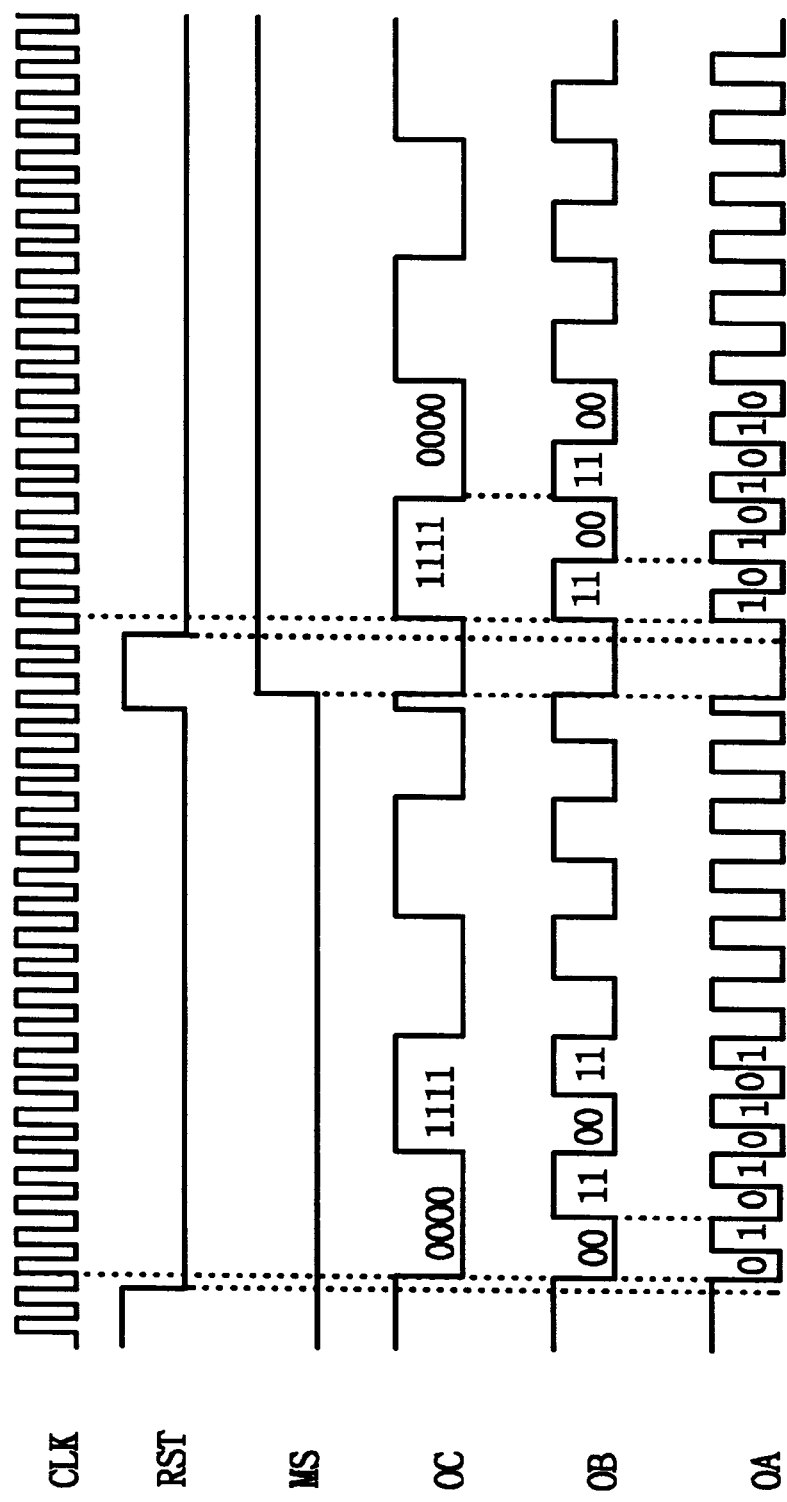
FIG. 6 is a waveform diagram according to the operation of the counter of the present invention.

As shown in FIG. 6, when the reset signal RST is HIGH, the output signal of the fourth inverter INV4 becomes LOW, and the output signal of the positive logic output Q in the D flipflop DFA, DFB or DFC is reset in a LOW level. When the reset signal RST is LOW, the output signal of INV4 becomes HIGH, and the D flipflop DFA, DFB and DFC are operated. That is, the output signal of the positive logic output Q in the D flipflop DFA synchronizes with a positive edge state of the clock signal CLK to generate a toggled signal, the output signal Q in the D flipflop DFB synchronizes with a positive edge state of the output signal Q in the D flipflop DFA to generate a toggled signal, and the output signal Q in the D flipflop DFC synchronizes with a positive edge state of the output signal Q in the D flipflop DFB to generate a toggled signal. Therefore, each of the output signals of the positive logic output Q in D flipflops DFA, DFB and DFC is down counted in sequence of 000-111-110-101- . . . -001-000.

When the logic state of the mode selection signal MS is LOW, the down mode signal input of each output signal state determiner DOWN receives a LOW level signal and the up mode signal input UP receives a HIGH level signal from the first inverter INV1. Therefore, the output terminal of each output signal state determiner OA, OB or OC generates a signal for the output signal Q inverted by the fifth inverter INV5. That is, the output terminal of each of the output signal state determiners OA, OB and OC carries out the operation of the up counter and the final signals are counted in sequence of 111-000-001-010- . . . -110-111.

On the other hand, when the state of the mode selection signal MS is HIGH, the down mode signal input of each output signal state determiner DOWN receives a HIGH level signal and the up mode signal input UP receives a LOW level signal from the first inverter INV1. Therefore, the output terminal of each output signal state determiner OA, OB and OC transmits the output signal Q in each D flipflop. That is, the output terminals OA, OB and OC carry out the operation of the down counter and the final signals are counted in sequence of 000-111-110-101- . . . -001-000 as the original counting values.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A counter comprising:
    an input unit receiving a plurality of control signals including a mode selection signal, a clock signal and a reset signal;
    a sampling unit receiving output signals of said input unit based on the clock signal and reset signal, said sampling unit having a plurality of latches and generating a plurality of first output signals and a plurality of second output signals, said plurality of latches being coupled to each other; and
    a determiner unit coupled to said sampling unit to receive the plurality of first output signals and coupled to said input unit to receive output signals of the input unit based on the mode selection signal, said determiner unit outputting a plurality of count signals indicative of count values, which are incremented or decremented based on the mode selection signal.

2. The counter of claim 1, wherein each of said plurality of latches includes a plurality of inputs, a first output that generates a corresponding first output signal and a second output that generates a corresponding second output signal, and said first and second outputs being coupled to corresponding inputs of an adjacent latch.

3. The counter of claim 2, wherein said plurality of latches comprises a plurality of D flip-flops.

4. The counter of claim 1, wherein said input unit comprises a plurality of inverters.

5. The counter of claim 1, wherein said determiner unit comprises a plurality of state determiners, each having a first input to receive the mode selection signal, a second input to receive an inverted mode selection signal, a third input for receiving a corresponding first output signal from the sampling unit and a counter output for generating a corresponding count signal.

6. The counter of claim 5, wherein each of said state determiners comprises:
    a first switch receiving the corresponding first output signal from the sampling unit;
    a second switch receiving an inverted first output signal, wherein said first and second switches are responsive to the mode selection signal and the inverted mode selection signal such that the count values are incremented or decremented.

7. The counter of claim 6, wherein said first and second switches comprise first and second transmission gates, and each state determiner further includes an inverter to invert the mode selection signal.

8. The counter of claim 1, wherein said input unit comprises:
    a first inverter to provide an inverted mode selection signal to said determiner unit;
    a plurality of serially coupled inverters to provide the clock signal and an inverted clock signal to said sampling unit; and
    a second inverter to provide an inverted reset signal.

9. The counter of claim 1, wherein said plurality of latches comprises a first flipflop having a first data input, first and second clock inputs, a reset input and first and second data outputs, said first and second clock inputs receiving the clock signal and an inverted clock signal, respectively, said reset input receiving an inverted reset signal, and said second data output being coupled to the first data input and said first data output providing one of said plurality of first output signals.

10. The counter of claim 9, wherein said plurality of latches further comprises a second flip-flop having a first data input, first and second clock inputs, a reset input and first and second data outputs, said first and second clock inputs of said second flip-flop being coupled to said first and second data outputs of the first flip-flop, respectively, said reset input of said second flip-flop receiving the inverted reset signal and said second data output of said second flip-flop being coupled to the first data input of said second flip-flop, wherein said first data output of said second flip-flop provides another one of said plurality of first output signal.

11. The counter of claim 10, wherein said plurality of latches further comprises a third flip-flop having a first data input, first and second clock inputs, a reset input and first and second data outputs, said first and second clock inputs of said third flip-flop being coupled to said first and second data outputs of the second flip-flop, respectively, said reset input of said third flip-flop receiving the inverted reset signal and said second data output of said third flip-flop being coupled to the first data input of said third flip-flop, wherein said first data output of said third flip-flop provides another one of said plurality of first output signal.

* * * * *